US00RE42623E

(19) United States
(12) Reissued Patent
Matsueda et al.

(10) Patent Number: US RE42,623 E
(45) Date of Reissued Patent: Aug. 16, 2011

(54) ELECTRO-OPTICAL APPARATUS, MATRIX SUBSTRATE, AND ELECTRONIC UNIT

(75) Inventors: Yojiro Matsueda, Chino (JP); Hayato Nakanishi, Toyama (JP)

(73) Assignee: Seiko Epson Corporation, Tokyo (JP)

(21) Appl. No.: 12/418,349

(22) Filed: Apr. 3, 2009

Related U.S. Patent Documents

Reissue of:
(64) Patent No.: 7,198,515
Issued: Apr. 3, 2007
Appl. No.: 11/099,594
Filed: Apr. 6, 2005

U.S. Applications:
(63) Continuation of application No. 10/637,638, filed on Aug. 11, 2003, now Pat. No. 6,887,100.

(30) Foreign Application Priority Data

Sep. 25, 2002 (JP) ..... 2002-278970
Aug. 4, 2003 (JP) ..... 2003-286292

(51) Int. Cl.
*H01R 33/945* (2006.01)

(52) U.S. Cl. ..... 439/577; 439/65

(58) Field of Classification Search ..... 439/577, 439/70, 65–69
See application file for complete search history.

(56) References Cited

U.S. PATENT DOCUMENTS

| | | | | |
|---|---|---|---|---|
| 4,432,604 | A | 2/1984 | Schwab | |
| 5,239,983 | A | 8/1993 | Katsurada | |
| 6,359,606 | B1 | 3/2002 | Yudasaka | |
| 6,525,704 | B1 | 2/2003 | Kondo et al. | |
| 6,538,374 | B2 | 3/2003 | Hosokawa | |
| 6,628,367 | B2 * | 9/2003 | Hirabayashi et al. | 349/187 |
| 6,630,784 | B2 | 10/2003 | Yoneda | |
| 6,833,668 | B1 | 12/2004 | Yamada et al. | |
| 6,864,638 | B2 | 3/2005 | Ishihara et al. | |
| 6,933,672 | B2 * | 8/2005 | Hosokawa | 313/504 |
| 6,951,495 | B2 | 10/2005 | Yoneda | |
| 7,250,718 | B2 * | 7/2007 | Hosokawa | 313/504 |
| 7,408,197 | B2 | 8/2008 | Ishihara et al. | |
| 2003/0045164 | A1 | 3/2003 | Echigo et al. | |
| 2007/0247064 | A1 * | 10/2007 | Hosokawa | 313/504 |
| 2008/0299861 | A1 | 12/2008 | Ishihara et al. | |

FOREIGN PATENT DOCUMENTS

| | | |
|---|---|---|
| JP | A-11-24606 | 1/1999 |
| JP | 11-074073 | 3/1999 |
| JP | A-11-251069 | 9/1999 |
| JP | A-2000-173766 | 6/2000 |
| JP | A-2000-0347621 | 12/2000 |

(Continued)

*Primary Examiner* — Jean F Duverne
(74) *Attorney, Agent, or Firm* — Oliff & Berridge, PLC

(57) ABSTRACT

To provide an electro-optical apparatus having a power-supply wiring structure that is capable of supplying a sufficient electrical power to a common electrode of electro-optical devices.

An electro-optical apparatus according to the present invention comprises electro-optical devices having a laminated structure including first electrode layers formed on or above a viewing area 11 of a substrate 15 and a second electrode layer 14 formed on or above the first electrode layers, the laminated structure further including first power lines for supplying a voltage to the first electrode layers and second power wiring 16 electrically connected to the second electrode layer, wherein the first power lines and the second power lines are arranged on or above the viewing area and are arranged in the same layer as the first electrode layers or below the first electrode layers.

14 Claims, 9 Drawing Sheets

FOREIGN PATENT DOCUMENTS

| | | | |
|---|---|---|---|
| JP | 2001-230086 | | 8/2001 |
| JP | A-2001-332383 | | 11/2001 |
| JP | 2002-040486 | | 2/2002 |
| JP | 2002-318556 | | 10/2002 |
| JP | A-2003-303687 | | 10/2003 |
| JP | 2004-014447 | | 1/2004 |
| KR | 2000-0068846 | A | 11/2000 |
| WO | WO 99/12394 | | 3/1999 |

* cited by examiner

ELECTRO-OPTICAL APPARATUS, MATRIX SUBSTRATE, AND ELECTRONIC UNIT

Matter enclosed in heavy brackets [ ] appears in the original patent but forms no part of this reissue specification; matter printed in italics indicates the additions made by reissue.

This is a Continuation of Application Ser. No. 10/637,638, filed Aug. 11, 2003 now U.S. Pat. No. 6,887,100. The entire disclosure of the prior application is hereby incorporated by reference herein in its entirety.

TECHNICAL FIELD

The present invention relates to the structure of power-supply wiring suitable for an electro-optical apparatus having electro-optical devices.

BACKGROUND ART

Organic electroluminescent (EL) devices, which are current-driven spontaneous light-emitting devices, have the advantages of requiring no backlight, low power consumption, wide viewing angle, and high contrast, and thus look promising for developing flat-panel displays. Organic EL devices are electro-optical devices in which a light-emitting layer having a fluorescent material is interposed between an anode and a cathode. Providing a forward-biased current between both electrodes causes positive holes injected from the anode and electrons injected from the cathode to recombine. By the resultant recombination energy, the organic EL device emits light. In other words, in order to cause light emission in the organic EL device, it is necessary to supply power from an external circuit. Typically, known active-matrix-addressing-type organic EL display panels use such a structure, that is, a pixel electrode, as the anode, is disposed for each pixel in a pixel area and a common electrode, as the cathode, covers the entire pixel area. Japanese Unexamined Patent Application Publication No. 11-24606 (Patent Document 1), for example, discloses a display device with reduced power consumption and improved luminous efficiency by optimizing the wiring layout.

[Patent Document 1] Japanese Unexamined Patent Application Publication No. 11-24606

DISCLOSURE OF THE INVENTION

Problems to be Solved by the Invention

In realizing a display panel using the electro-optical devices, the wiring resistance of the common electrode is an issue. Specifically, a higher wiring resistance of the common electrode leads to an increased voltage drop in pixels in the center of the screen, thereby failing to supply sufficient current to the central part of the screen. As a consequence, a gray-scale is not displayed accurately and display performance decreases. This matter may become a serious problem in a larger display panel because the wiring resistance of the common electrode becomes higher. Decreasing the resistance of the common electrode is a problem to be solved especially in a so-called top-emission structure, in which light is emitted from the side of a transparent cathode, since a material has not yet been developed that has the same level of low resistance as a metal layer and that is also suitable for a light-transmitting electrode.

Accordingly, an object of the present invention is to propose an electro-optical apparatus and a matrix substrate having a structure for power-supply wiring that is capable of providing a sufficient power to a common electrode of electro-optical devices. Moreover, an object of the present invention is to provide an electro-optical apparatus and a matrix substrate that are capable of reducing the width of a display panel frame.

Means for Solving the Problems

An electro-optical apparatus according to the present invention comprises electro-optical devices having a laminated structure including first electrode layers formed on or above a viewing area of a substrate and a second electrode layer formed on or above the first electrode layers, the laminated structure further including first power lines for supplying a voltage to the first electrode layers and second power lines electrically connected to the second electrode layer, wherein the first power lines and the second power lines are arranged on or above the viewing area and are arranged in the same layer as the first electrode layers or below the first electrode layers.

As described above, the second power lines electrically connected to the second electrode layer are formed in any layer of the laminated structures formed above the viewing area of the substrate so that sufficient electric power is supplied even if the second electrode layer show high resistance. Furthermore, joints electrically connecting the second electrode layer with the second power lines are included within the laminated structures, thus reducing the width of a display panel frame.

The term "the electro-optical devices" means general electronic devices that change optical states of light by electrical operations and include a self-luminous device such as an electroluminescent device and an electronic device displaying a gray-scale by varying a state of deflection of light, such as a liquid crystal device. "The viewing area" means an area in the substrate used for electro-optical displays, i.e., an area in which the electro-optical devices are formed and is equivalent to "a display area" of embodiments in the present invention. "The laminated structures" mean laminated structures comprising various thin films laminated on or above the substrate and include not only device layers comprising the electro-optical devices but also an insulating interlayer film, the electrode layers, the power lines, and the like. Electronic devices such as a transistor may lie between the first electrode layers and the first power lines in the invention. The first power lines and the second power lines may be formed in the same layer for the sake of convenience in the manufacturing process or may be formed in different layers.

In the electro-optical apparatus according to the present invention, preferably, the first power lines and the second power lines are disposed in the same layer at least partially, thus simplifying the manufacturing process.

In the electro-optical apparatus according to the present invention, preferably, the second electrode layer functions as a cathode for the electro-optical devices. The second electrode layer functioning as the cathode allows a reduction in resistance of the cathode in the electro-optical devices.

In the electro-optical apparatus according to the present invention, preferably, the second power lines function as auxiliary cathode lines. Thereby, a sufficient electrical power is supplied to the cathode in the electro-optical devices.

In the electro-optical apparatus according to the present invention, preferably, the second electrode layer has light transmission. Thereby, a top-emission structure in which light is emitted through the second electrode layer is achieved, thus increasing an aperture ratio.

In the electro-optical apparatus according to the present invention, preferably, the second power lines are formed linearly in any one of layers of the laminated structure at a predetermined density. Distributing the second power lines at the predetermined density allows a reduction in resistance of the second electrode layer.

In the electro-optical apparatus according to the present invention, preferably, the second power lines and the second electrode layer are formed in different layers of the laminated structure and are electrically connected to each other within the laminated structure. Positions where the second power lines are electrically connected to the second electrode layer are disposed within the laminated structures, thus reducing the width of a display panel frame.

In the electro-optical apparatus according to the present invention, preferably, positions where the second power lines are electrically connected to the second electrode layer are disposed along the direction in which the second power lines extend at multiple positions. The second power lines and the second electrode layer are electrically connected at the multiple positions so that a reduction in resistance of the second electrode layer is achieved.

In the electro-optical apparatus according to the present invention, preferably, the second power lines and the second electrode layer are formed in different layers with an insulating interlayer film disposed therebetween and are electrically connected to each other through contact holes formed in the insulating interlayer film. The second power lines and the second electrode layer are formed in different layers of the laminated structure so that manufacturing processes thereof are separated.

In the electro-optical apparatus according to the present invention, preferably, the electro-optical devices are arranged in two substantially orthogonal directions, and the second power lines are arranged in a direction substantially along the direction in which either direction of the two orthogonal directions in which the electro-optical devices are arranged. The direction of arranging the second power lines is along the direction in which the direction of arranging the electro-optical devices so that sufficient electrical power is supplied to the second electrode layer of the electro-optical devices arranged in the two orthogonal directions.

In the electro-optical apparatus according to the present invention, preferably, the second power lines are disposed at substantially equal pitch. The second power lines are equally spaced so that electrical power is uniformly supplied to each of the electro-optical devices disposed in the two orthogonal directions.

In the electro-optical apparatus according to the present invention, preferably, the electro-optical devices are electroluminescent devices. The electroluminescent device is used so that a luminance gray-scale is adjusted by a driving current.

An electronic unit according to the present invention includes the above-described electro-optical apparatus. The electronic unit may be of any type as long as it includes a display apparatus. The electronic unit may be a mobile phone, a video camera, a personal computer, a head-mounted display, a projector, a facsimile machine, a digital camera, a mobile television, a DSP apparatus, a PDA, or an electronic notepad.

A matrix substrate according to the present invention forms electro-optical devices consist of a laminated structure comprising first electrode layers and a second electrode layer, the matrix substrate further comprising the first electrode layers formed on or above a substrate; first power lines supplying a voltage to the first electrode layers; and second power lines electrically connected to the second electrode layer to be formed on or above the first electrode layers, wherein both of the first power lines and the second power lines are arranged on or above the viewing area and are arranged in the same layer as the first electrode layers or below the first electrode layers.

As described above, the second power lines are electrically connected to the second electrode layer in either layer of the laminated structure of the electro-optical devices to be laminated on or above the viewing area of the substrate so that sufficient electric current is supplied to each of the electro-optical devices even if the second electrode layer shows high resistance. Furthermore, positions where the second power lines are electrically connected to the second electrode layer are disposed within the laminated structures, thus reducing the width of a display panel frame. The term "matrix substrate", as used in here, means a wiring substrate in which the electro-optical devices have not been formed.

In the matrix substrate according to the present invention, preferably, the first power lines and the second power lines are disposed in the same layer at least partially, thus simplifying the manufacturing process.

In the matrix substrate according to the present invention, preferably, the second electrode layer functions as a cathode for the electro-optical devices, thus reducing resistance of the cathode of the electro-optical devices.

In the matrix substrate according to the present invention, preferably, the second power lines function as auxiliary cathode wiring, thereby supplying sufficient electrical power to the cathode of the electro-optical devices.

In the matrix substrate according to the present invention, preferably, the second electrode layer has light transmission.

Thereby, a top-emission structure in which light is emitted from the second electrode layer is achieved, thus raising an aperture ratio.

In the matrix substrate according to the present invention, preferably, the second power lines are formed linearly in any one of layers of the laminated structure at a predetermined density. Distributing the second power lines at the predetermined density allows a reduction in resistance of the second electrode layer.

In the matrix substrate according to the present invention, preferably, the second power lines and the second electrode layer are formed in different layers of the laminated structure and are electrically connected to each other within the laminated structure. Positions where the second power lines are electrically connected to the second electrode layer are disposed within the laminated structures, thus reducing the width of a display panel frame.

In the matrix substrate according to the present invention, preferably, the second power lines are electrically connected to the second electrode layer are disposed along the direction in which the second power lines extend at multiple positions.

The second power lines and the second electrode layer are electrically connected at the multiple positions so that a reduction in resistance of the second electrode layer is achieved.

In the matrix substrate according to the present invention, preferably, the second power lines and the second electrode layer are formed in different layers with an insulating interlayer film disposed therebetween, and the second power lines and the second electrode layer are electrically connected to each other through contact holes formed in the insulating interlayer film The second power lines and the second electrode layer are formed in different layers of the laminated structure so that manufacturing processes thereof are separated.

In the matrix substrate according to the present invention, preferably, the electro-optical devices are arranged in two substantially orthogonal directions, and the second power lines are arranged in a direction substantially along the direction in which either direction of the two orthogonal directions in which the electro-optical devices are arranged. The direction of arranging the second power lines is along the direction in which the direction of arranging the electro-optical devices so that sufficient electrical power is supplied to the second electrode layer of the electro-optical devices arranged in the two orthogonal directions.

In the matrix substrate according to the present invention, preferably, the second power lines are disposed at substantially equal pitch. The second power lines are equally spaced so that electrical power is uniformly supplied to each of the electro-optical devices disposed in the two orthogonal directions.

BEST MODE FOR CARRYING OUT THE INVENTION

First Embodiment

The embodiment will be illustrated with reference to the drawings.

FIG. 1 shows an entire block diagram of an active-matrix-type organic EL display panel 100 of the embodiment. As illustrated in FIG. 1, a plurality of pixels 10, a scanning line driver 12, and a data line driver 13 are disposed on or above a substrate 15. The plurality of pixels 10 have laminated structures disposed on a display area 11. The scanning line driver 12 outputs scanning signals to scanning lines, which are disposed in a row direction and connected to a group of the pixels 10. The data line driver 13 supplies data signals and power supply voltages to data lines and power supply lines, respectively. The data lines and the power supply lines are disposed in a column direction and connected to a group of the pixels 10. The pixels 10 form an N-row, M-column pixel matrix, in which the row direction and the column direction are disposed orthogonally and form a pixel matrix. Each of the pixels 10 includes an organic EL device emitting light with red, green, and blue (RGB), the three primary colors. The entire surface of the laminated structure disposed on the display area 11 is covered with a film of a cathode 14 which serves as a common electrode. The cathode 14 is preferably made of a material that is capable of injecting as many electrons as possible, i.e., a material having a low work function. Preferably, such a conductive material is a thin metal film made of calcium, lithium, or aluminum.

The organic EL display panel 100 has a bottom-emission structure that emits light through the substrate 15; however, the present invention is not limited to this structure. The organic EL display panel 100 may have a so-called top-emission structure that emits light through the cathode 14 if the cathode 14 is a light-transmitting conductive film. In the organic EL display panel 100 having the top-emission structure, the cathode 14 may be formed of a semitransparent conductive metal layer obtained by processing a thin metal film such as a calcium, lithium, or aluminum film to be thin so as to be able to transmit a light, in addition to a light-transmitting conductive material such as an indium tin oxide (ITO). Such a semitransparent conductive metal layer allows the cathode 14 to have low resistance.

FIG. 2 shows a main circuit of one of the pixels 10. The pixel 10 includes a switching transistor Tr1, a driving transistor Tr2, a storage capacitor C, and a light-emitting section OLED. The two transistors control the driving of the pixel 10. The switching transistor Tr1 is an n-channel FET, in which the gate terminal is connected to a scanning line $V_{sel}$ and the drain terminal is connected to a data line $I_{dat}$. The driving transistor Tr2 is a p-channel FET, in which the gate terminal is connected to the source terminal of the switching transistor Tr1. In the driving transistor Tr2, the source terminal is connected to a power supply line $V_{dd}$ and the drain terminal is connected to the light-emitting section OLED. The storage capacitor C is provided between the gate terminal and the source terminal of the driving transistor Tr2. In the above-described arrangement, when a selection signal is output to the scanning line $V_{sel}$ and when the switching transistor Tr1 is opened, a data signal supplied over the data line $I_{dat}$ is written in the storage capacitor C as a voltage. The written voltage in the storage capacitor C is then stored during one frame period, changing a conductance of the driving transistor Tr2 in an analog fashion and providing a forward-biased current corresponding to a luminance gray-scale to the light-emitting section OLED.

FIG. 3 illustrates the wiring layout in a pixel area. In order to decrease resistance of the cathode 14, in the present invention, fine auxiliary cathode wiring 16 is formed in a layer different from the wide cathode 14 covering the upper surface of the laminated structure laminated on the display area 11. The cathode 14 is electrically connected to the auxiliary cathode wiring 16 with an insulating interlayer film disposed therebetween. The auxiliary cathode wiring 16 may be formed in any layer, however in view of a display manufacturing process, however, the auxiliary cathode wiring 16 are preferably formed in the same layer as metal wiring such as the scanning lines $V_{sel}$ in the same manufacturing process, thus simplifying the overall process and allowing low manufacturing cost. The auxiliary cathode wiring 16 that are formed in the same process as the scanning lines $V_{sel}$ may be called a gate metal layer. The auxiliary cathode wiring 16 are preferably positioned on dead spaces of the pixels 10. Since the dead spaces vary according to the layout of the pixels 10, the auxiliary cathode wiring 16 should be disposed at the most suitable position in consideration of the positions of the data lines $I_{dat}$, the scanning lines $V_{sel}$, power supply lines $V_{dd}$, the switching transistors Tr1 or the like. In the case of overlapping the auxiliary cathode wiring 16 with the data lines $I_{dat}$, a parasitic capacitance may be produced between the data lines $I_{dat}$ and the auxiliary cathode wiring 16, resulting in insufficient data writing to the storage capacitor C. Therefore, the positional relationship with the data lines $I_{dat}$ should be considered when forming the auxiliary cathode wiring 16.

In this embodiment, one auxiliary cathode line 16 and a pair of the scanning lines $V_{sel}$ are laid out alternately in the row direction. In other words, N/2 auxiliary cathode wiring 16 are disposed in such a way that one auxiliary cathode line 16 appears every other row. The scanning lines $V_{sel}$ and the auxiliary cathode wiring 16 are produced by simultaneously patterning the metal wiring in the same layer, respectively. The width of one auxiliary cathode line 16 is adjusted so as to substantially be equal to the sum of the widths of the pair of the scanning lines $V_{sel}$. One data line $I_{dat}$ and one power supply line $V_{dd}$ are disposed in every column in the column direction respectively. The pattern of wiring shown in FIG. 3 illustrates a periodically repeating unit which is applied to all of the pixels 10 in a laminated structure. The layout of wiring in this embodiment is symmetrical about any line, and the pitches of the pixels in the row direction and column direction are determined uniformly. Each of the switching transistors Tr1 resides at the intersection of the data line $I_{dat}$ and the scanning line $V_{sel}$. The gate terminal of each of the driving transistors Tr2 is oriented in the direction in which the source terminal of the switching transistor Tr1 extends. The drain terminal of the driving transistor Tr2 is connected to each of pixel electrodes 17 through a contact hole h1. The storage capacitors C are formed in the longitudinal direction of the pixel electrode 17 above the power supply lines $V_{dd}$.

FIG. 4 is a cross-sectional view taken along the line A-A' of FIG. 3. Referring to FIG. 4, a laminated structure 30 in which the auxiliary cathode line 16, an insulating interlayer film 21, source metal layers 22, a planarizing film 20, ITO layers 18, and a bank layer 19 are sequentially laminated is formed in the display area 11 on the substrate 15. The upper surface of the laminated structure 30 is covered with the cathode 14. The insulating interlayer film 21 is a insulating film to electrically separate the data lines $I_{dat}$ and the scanning lines $V_{sel}$ from the auxiliary cathode wiring 16. The islanded source metal layers 22 which are patterned in the same process as the data lines $I_{dat}$ and the scanning lines $V_{sel}$ are formed on the insulating interlayer film 21. The source metal layers 22 are connected to the auxiliary cathode line 16 through contact holes h5 formed in the insulating interlayer film 21. The planarized insulating film 20 is formed on the insulating interlayer film 21. The islanded ITO layers 18 are formed by patterning on the planarizing film 20. The ITO layers 18 are connected to the source metal layers 22 through contact holes h3 formed in the planarizing film 20. The contact holes h3 are formed at multiple positions along the direction in which the auxiliary cathode line 26 extends. Preparing many joints connecting the ITO layer 18 and the source metal layer 22 allows a reduction in the electrical resistance.

On the other hand, the upper surface of the planarizing film 20 is covered with the bank layer 19, which is made of a photosensitive organic material or the like. The bank layer 19 is a component for partitioning the pixels 10. Oval openings h2 are opened by a precise alignment so as to position on the pixel electrodes 17 (see FIG. 3). On portions where the surfaces of the pixel electrodes 17 are exposed through the openings h2, positive-hole transporting layers and light-emitting layers are formed sequentially from the lower layer adjacent to the substrate. Additionally, the cathode 14 as a common electrode is formed so as to cover the upper surface of the laminated structure 30 disposed on the display area 11. In this way, light-emitting sections OLED are formed, which consist of the cathode, the light-emitting layer, the positive-hole transporting layer, and one pixel electrode.

The laminated structure of the device layer constituting the light-emitting section OLED is not limited to the above-described configuration. Other examples of the laminated structure are as follows: a cathode, a light-emitting layer, and a pixel electrode; a cathode, an electron transporting layer, a light-emitting layer, and a pixel electrode; a cathode, an electron transporting layer, a light-emitting layer, a positive-hole transporting layer, and a pixel electrode. In fact, a positive-hole transporting layer and an electron transporting layer are necessarily required and these layers may be added freely. The positive-hole transporting layer may be a triphenylamine derivative (TPD), a hydrazine derivative, or an arylamine derivative. The electron transporting layer may be an aluminum-quinolinol complex ($Alq_3$), a distyrylbiphenyl derivative (DPVBi), an oxadiazole derivative, a bistyrylanthracene derivative, a benzoxazolethiophene derivative, perylenes, or thiazoles. The light-emitting layer is not limited to an organic material and may be made of an inorganic material.

In the surface of the bank layer 19, openings h4, which are aligned precisely at multiple positions communicating to the ITO layers 18, are disposed in the direction in which the auxiliary cathode line 16 extends at multiple positions. The cathode 14 covering the bank layer 19 is connected to the ITO layers 18 through the contact holes h4 and is also connected to the auxiliary cathode line 16 through the source metal layers 22. In this way, the auxiliary cathode line 16 formed in the laminated structure 30 is connected to the cathode 14 so that the electrical resistance decreases and thus sufficient current is supplied to each of the pixels 10.

This embodiment allows a reduction in the resistance of the cathode 14 and in luminance non-uniformity resulting from non-uniformity of the currents supplied to the pixels 10. Contact areas for the cathode 14 with the cathode power supply lines lie in a frame of the display panel in known panels. According to this embodiment, such contact is ensured by the laminated structure 30, thus reducing the width of the frame and resulting in a display panel with smaller dead space. Since the bank layer, which is made of the organic material, has low resistance to heat and chemicals, it is difficult to form the auxiliary cathode line 16 on the bank layer, but it is easy to form metal wiring such as the auxiliary cathode line 16 on the substrate 15 provided with the FET or the like.

Although one auxiliary cathode line 16 is disposed every two rows in this embodiment, it is not limited therto and the auxiliary cathode wiring 16 may be disposed at any suitable density such as one line every n rows (n is an integer more than two). The position of the auxiliary cathode line 16 is not limited to on the substrate 15; it may be in any layer of the laminated structure 30.

Second Embodiment

FIG. 5 shows the layout of wiring in an organic EL display panel 100 according to a second embodiment of the present invention. This embodiment differs from the first embodiment on the point of that auxiliary cathode wiring 16 are disposed in the column direction. Referring to FIG. 5, where one pixel consists of three RGB picture elements, three auxiliary cathode wiring 16 are spaced uniformly every two pixels in the column direction. Two data lines $I_{dat}$ are disposed at two sides of each auxiliary cathode line 16. Between adjacent auxiliary cathode wiring 16, two power supply lines $V_{dd}$ are formed as a pair. The sum of the widths of the one auxiliary cathode line 16 and the two data lines $I_{dat}$ is substantially equal to the sum of the widths of the pair of power supply lines $V_{dd}$. Thereby, the layout of the wiring shown in this figure is arranged so as to have symmetry about any column. On the other hand, in the row direction, one of scanning lines $V_{sel}$ is disposed in each row. Each of switching transistors Tr1 resides at the intersection of the scanning line $V_{sel}$ and one data line $I_{dat}$. The gate terminal of each of driving transistors Tr2 is oriented in the direction in which the source terminal of the switching transistor Tr1 extends. The drain terminal of the driving transistor Tr2 is connected to each of pixel electrodes 17 through each of contact holes h1. The storage capacitors C are formed in the longitudinal direction of the pixel electrode 17 above the power supply lines $V_{dd}$.

FIG. 6 is a cross-sectional view taken along the line B-B' of FIG. 5. Referring to FIG. 6, a laminated structure 30 in which the scanning lines $V_{sel}$, an insulating interlayer film 21, the auxiliary cathode wiring 16, a planarizing film 20, ITO layers 18, and a bank layer 19 are sequentially laminated, is formed in the display area 11 on the substrate 15. The upper surface of the laminated structure 30 is covered with the film of the cathode 14. The insulating interlayer film 21 is a film to electrically separate the scanning lines $V_{sel}$ from the auxiliary cathode wiring 16. The linear auxiliary cathode line 16 is formed on the insulating interlayer film 21. The ITO layers 18 are islanded by patterning in the direction in which the auxiliary cathode line 16 extends at multiple positions and are disposed on the planarizing film 20, which covers the auxiliary cathode line 16. Contact holes h3 are formed in the planarizing film 20 so that the ITO layers 18 are connected to the auxiliary cathode wiring 16 through the contact holes h3. The upper surface of the planarizing film 20 is covered with the bank layer 19, which is made of a photosensitive organic material or the like. Oval openings h2 are formed on the pixel electrodes 17 by a precise alignment (see FIG. 5). Like the first embodiment, light-emitting sections OLED are formed in the openings h2.

On the surface of the bank layer 19, openings h4, which are aligned precisely at multiple positions communicating to the ITO layers 18, are disposed in the direction in which the auxiliary cathode line 16 extends. The cathode 14 covering the bank layer 19 is connected to the ITO layers 18 through the contact holes h4 and is also connected to the auxiliary cathode line 16. In this way, a plurality of the linear auxiliary cathode wiring 16 formed along the column direction of the pixels 10 are electrically connected to the cathode 14 so that the sufficient current is supplied to each of the pixels 10.

This embodiment allows, like the first embodiment, a reduction in the resistance of the cathode 14 and in the luminance non-uniformity resulting from non-uniformity of the currents supplied to the pixels 10. Additionally, contact of the auxiliary cathode wiring 16 with cathode 14 is ensured within the laminated structure 30, thus reducing the width of the frame and resulting in a display panel with smaller dead space. Although one auxiliary cathode line 16 is disposed-every two columns in this embodiment, it is not limited thereto and the auxiliary cathode wiring 16 may be disposed at a suitable density such as one line every n rows (n is an integer more than two).

Third Embodiment

FIG. 7 shows the layout of wiring in an organic EL display panel 100 according to a third embodiment of the present invention. This embodiment differs from the first and second embodiments on the point of that auxiliary cathode wiring 16 are disposed in both the row and the column directions. For the sake of distinguishing between the auxiliary cathode wiring 16 which are disposed in both the row and the column directions, the auxiliary cathode wiring 16 disposed along the row direction are called first auxiliary cathode wiring 16-1, while the auxiliary cathode wiring 16 disposed along the column direction are called second auxiliary cathode wiring 16-2. When the "auxiliary cathode wiring 16" is simply used, it includes both. Referring to FIG. 7, where one pixel consist of three RGB picture elements, three second auxiliary cathode wiring 16-2 are spaced uniformly every two pixels in the column direction. Two data lines $I_{dat}$ are disposed at two sides of each of the second auxiliary cathode wiring 16-2. Between adjacent second auxiliary cathode wiring 16-2, two power supply lines $V_{dd}$ are formed as a pair. The sum of the widths of one second auxiliary cathode line 16-2 and the two data lines $I_{dat}$ is substantially equal to the sum of the widths of the two power supply lines $V_{dd}$. Therefore, the layout of the wiring shown in this figure is arranged so as to have symmetry about any column.

On the other hand, a pair of scanning lines $V_{sel}$ and one first auxiliary cathode line 16-1 are laid out alternately in the row direction. The scanning lines $V_{sel}$ and the first auxiliary cathode wiring 16-1 are produced by simultaneously patterning the metal wiring in the same layer, respectively. The width of one first auxiliary cathode line 16-1 is adjusted so as to be substantially equal the sum of the widths of the two scanning lines $V_{sel}$. Therefore, the layout of the wiring shown in this figure is arranged so as to have symmetry about any row and column.

Each of switching transistors Tr1 resides at each intersection of the scanning lines $V_{sel}$ and the data lines $I_{dat}$. The gate terminal of each of driving transistors Tr2 is positioned in the direction in which the source terminal of the switching transistor Tr1 extends. The drain terminal of the driving transistor Tr2 is connected to each of pixel electrodes 17 through each of contact holes h1. Above the power supply lines $V_{dd}$, storage capacitors C are formed parallel to the longitudinal direction of the pixel electrode 17.

FIG. 8 is a cross-sectional view taken along the line C-C' of FIG. 7. Referring to FIG. 8, a laminated structure 30 in which the first auxiliary cathode line 16-1, insulating interlayer film 21, a planarizing film 20, source metal layers 22, ITO layers 18, and a bank layer 19 are sequentially laminated, is formed on the display area 11 and on the substrate 15. The upper surface of the laminated structure 30 is covered with the film of a cathode 14. The insulating interlayer film 21 is a film to electrically separate the data lines $I_{dat}$ and the power supply lines $V_{dd}$ from the first auxiliary cathode line 16-1. In the same layer as the data lines $I_{dat}$ and the power supply lines $V_{dd}$, the second auxiliary cathode wiring 16-2 are disposed in the direction orthogonal to the first auxiliary cathode line 16-1. The first auxiliary cathode line 16-1 and the second auxiliary cathode wiring 16-2 are electrically connected through contact holes h6 formed in the insulating interlayer film 21.

On the insulating interlayer film films 21, the islanded source metal layers 22 are formed at multiple positions in the same layer as the second auxiliary cathode wiring 16-2 in the direction in which the first auxiliary cathode line 16-1 extends.

The source metal layers 22 are connected to the first auxiliary cathode line 16-1 through contact holes h5 formed in the insulating interlayer film 21. On the planarizing films 20, the islanded ITO layers 18 are disposed in a direction in which the first auxiliary cathode line 16-1 extend at multiple positions and are connected to the source metal layers 22 through contact holes h3. The hank layer 19, which is made of a photosensitive organic material or the like is formed on the planarizing films 20. Oval openings h2 are positioned on the pixel electrode 17 by a precise alignment (see FIG. 7). Like the first embodiment, light-emitting sections OLED are formed in the openings h2. In the surface of the bank layers 19, contact holes h4, which are aligned precisely at multiple positions communicating to the ITO layers 18, are disposed in the direction in which the second auxiliary cathode wiring 16-2 extend. The cathode 14 formed on the bank layers 19 is connected to the auxiliary cathode wiring 16 in the laminated structure 30 so that the electrical resistance decreases and thus sufficient current is supplied to each of the pixels 10.

FIG. 9 is a cross-sectional view taken along the line D-D' of FIG. 7. Referring to FIG. 9, the laminated structure 30 in which the first auxiliary cathode wiring 16-1, the scanning lines $V_{sel}$, the insulating interlayer film 21, the second auxiliary cathode line 16-2, the planarizing film 20, the ITO layers 18, and the bank layers 19 are sequentially laminated, is formed on the substrate 15. The first auxiliary cathode wiring 16-1 and the second auxiliary cathode line 16-2 are orthogonally disposed with sandwiching the insulating interlayer film 21 therebetween and are connected to each other through contact holes h6 formed in the insulating interlayer film 21. The islanded ITO layers 18 are disposed on the planarizing films 20, which are laminated on the second auxiliary cathode line 16-2, in the direction in which the second auxiliary cathode line 16-2 extends. The ITO layers 18 are connected to the second auxiliary cathode line 16-2 through the contact holes h3 formed in the planarizing films 20. The contact holes h4 are formed in the bank layer 19 at multiple positions in the direction in which the second auxiliary cathode line 16-2 extends, thereby connecting the cathode 14 with the ITO layers 18. In this way, the cathode 14 is connected to the auxiliary cathode wiring 16, which are formed by orthogonal lines, in the laminated structure 30 so that the resistance of the cathode 14 is greatly reduced and thus sufficient electrical power is supplied to each of the pixels 10. Therefore, the luminance non-uniformity resulting from non-uniformity of the currents supplied to the pixels 10 is reduced, achieving excellent display performance. Additionally, contact of the auxiliary cathode wiring 16 with the cathode 14 is ensured within the laminated structure 30, thus reducing the width of the frame and resulting in a display panel with smaller dead space.

Fourth Embodiment

FIG. 10 shows examples of electronic units to which the electro-optical apparatus of the present invention is applicable. FIG. 10(a) shows an application to a mobile phone. A mobile phone 230 includes an antenna 231, a sound-output section 232, a sound-input section 233, an operating section 234, and the organic EL display panel 100 of the present invention. The organic EL display panel 100 is usable as a display of the mobile phone 230. FIG. 10(b) shows an application to a video camera. A video camera 240 includes a picture-receiving section 241, an operating section 242, a sound-input section 243, and the organic EL display panel 100 of the present invention. The organic EL display panel 100 is usable as a viewfinder or a display. FIG. 10(c) shows an application to a mobile personal computer. A computer 250 includes a camera 251, an operating section 252, and the organic EL display panel 100 of the present invention. The organic EL display panel 100 of the present invention is usable as a display apparatus.

FIG. 10(d) shows an application to a head-mounted display. A head-mounted display 260 includes a band 261, an optical device holder 262, and the organic EL display panel 100 of the present invention. The organic EL display panel 100 is usable as a source of displaying images. FIG. 10(e) shows an application to a rear-type projector. A projector 270 includes a case 271, a light source 272, a combining optical system 273, a mirror 274, a mirror 275, a screen 276, and the organic EL display panel 100 of the present invention. FIG. 10(f) shows an application to a front-type projector. A projector 280 includes a case 282, an optical system 281, and the organic EL display panel 100 of the present invention. Images can be displayed on a screen 283. Thus, the organic EL display panel 100 of the present invention is usable as a source of displaying images.

REFERENCE NUMERALS

Figure 1:
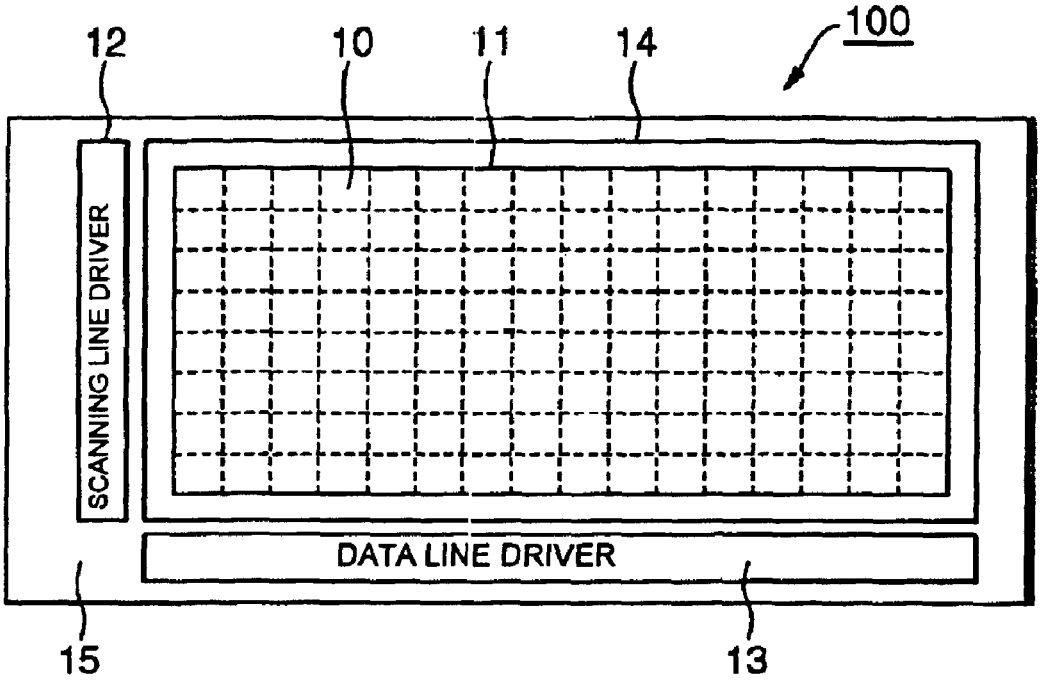
FIG. 1 is an entire block diagram of an organic EL display panel of the present invention.
Figure 2:
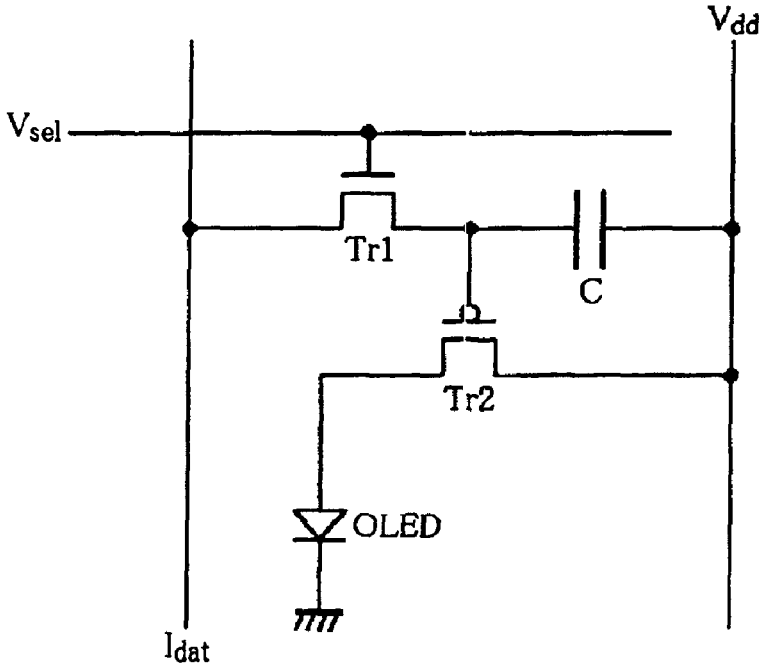
FIG. 2 shows a block diagram of a main pixel circuit.
Figure 3:
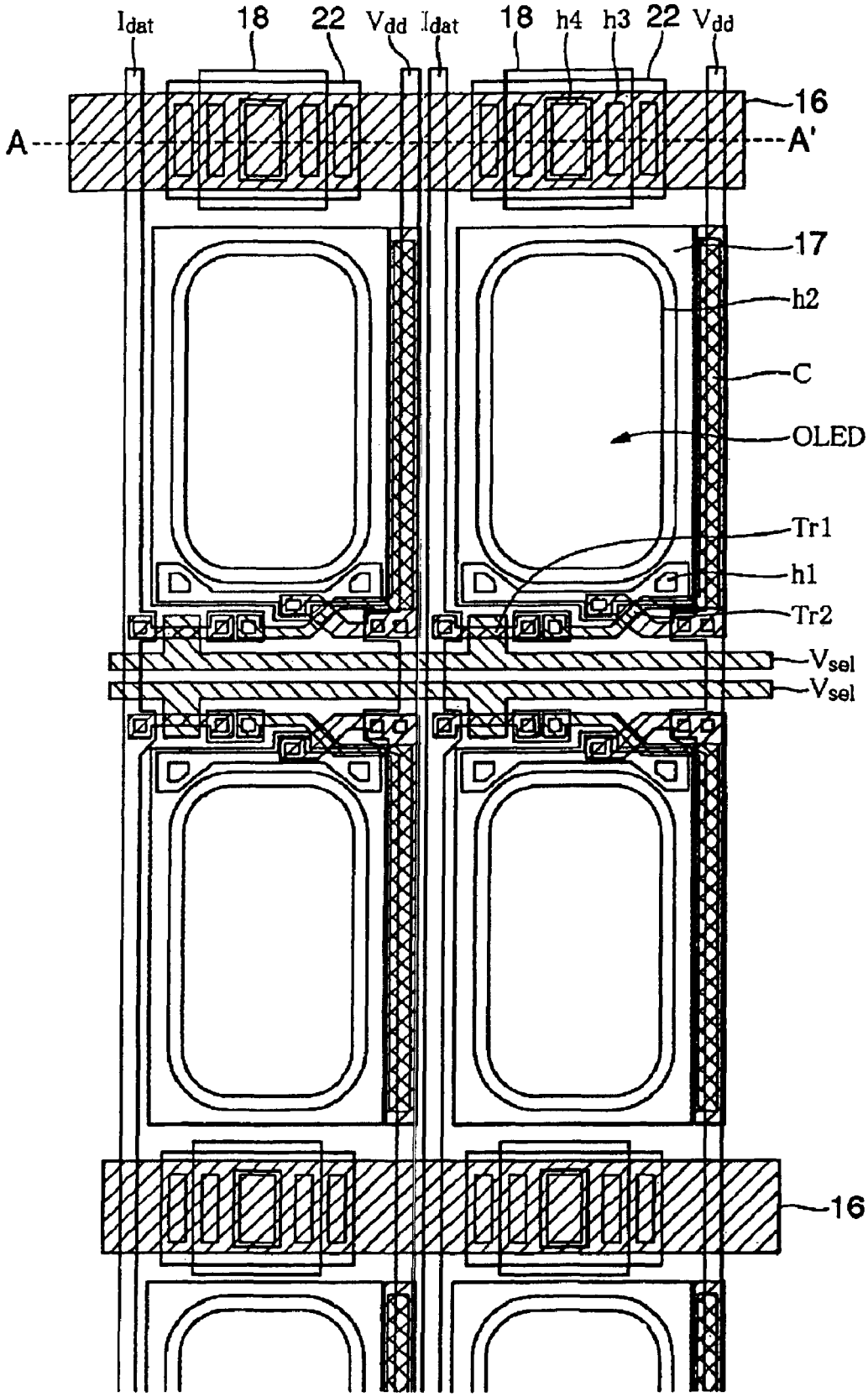
FIG. 3 shows a layout of wiring of the first embodiment of the present invention.
Figure 4:
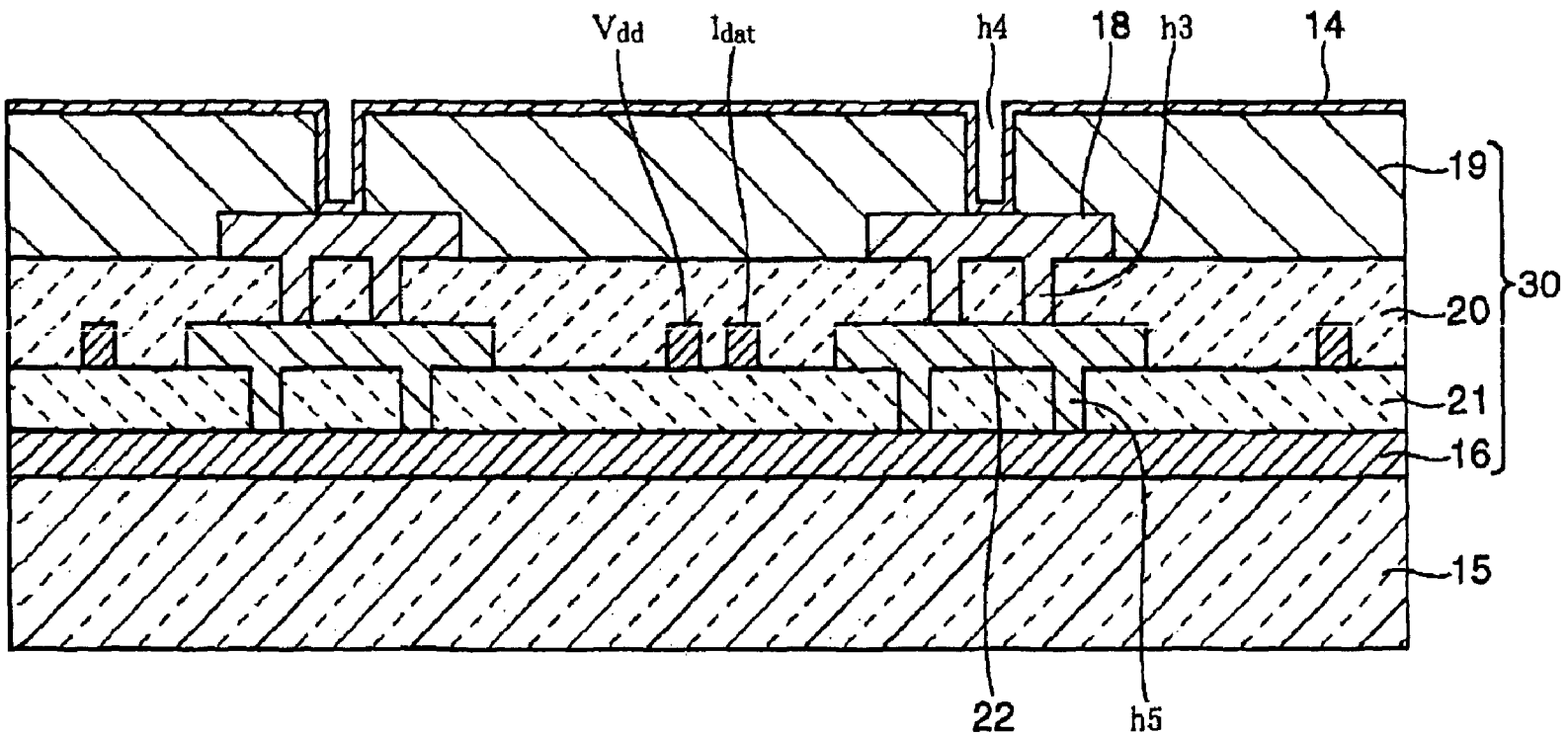
FIG. 4 is a cross-sectional view taken along the line A-A' of FIG. 3.
Figure 5:
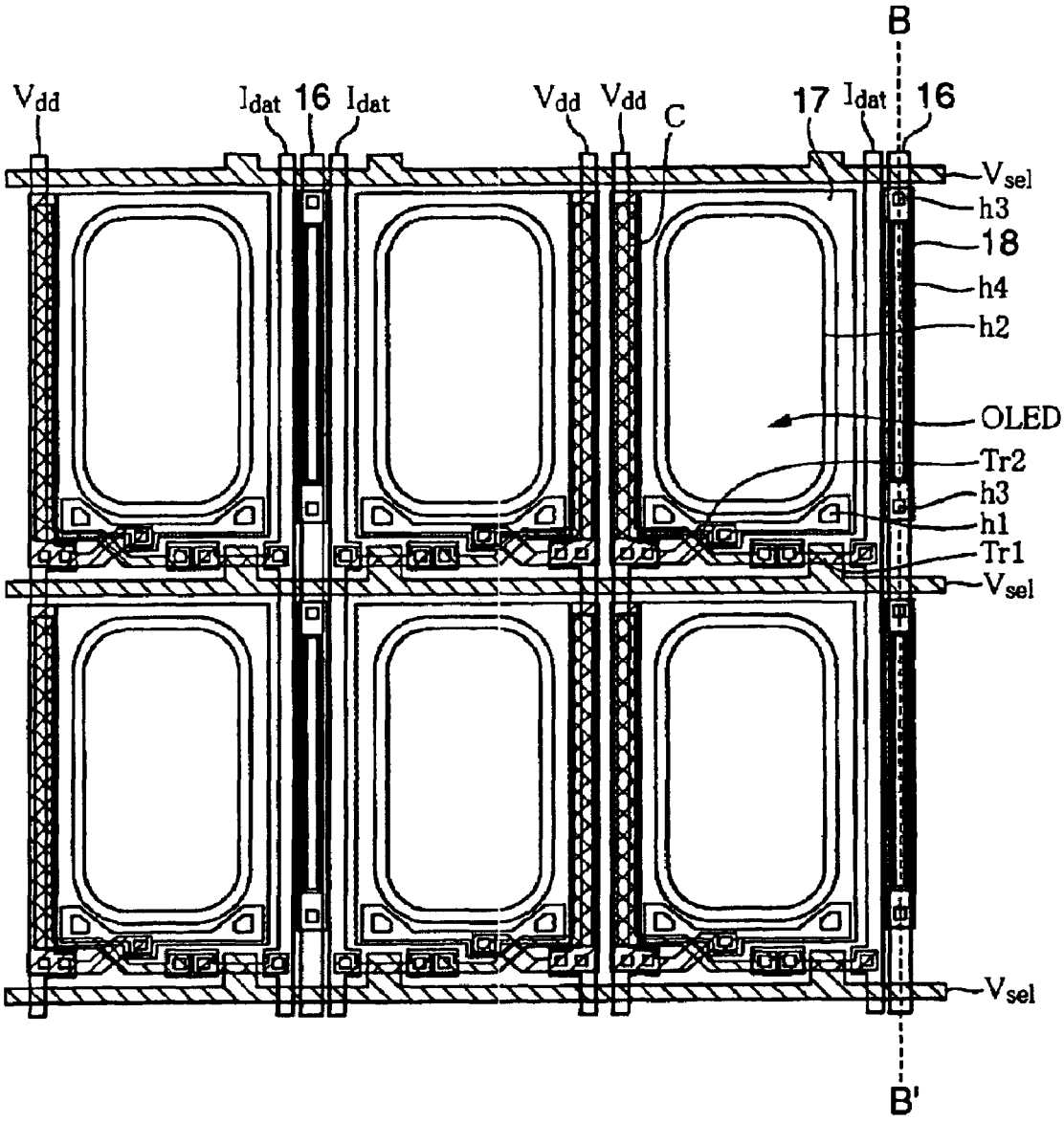
FIG. 5 shows a layout of wiring of the second embodiment of the present invention.
Figure 6:
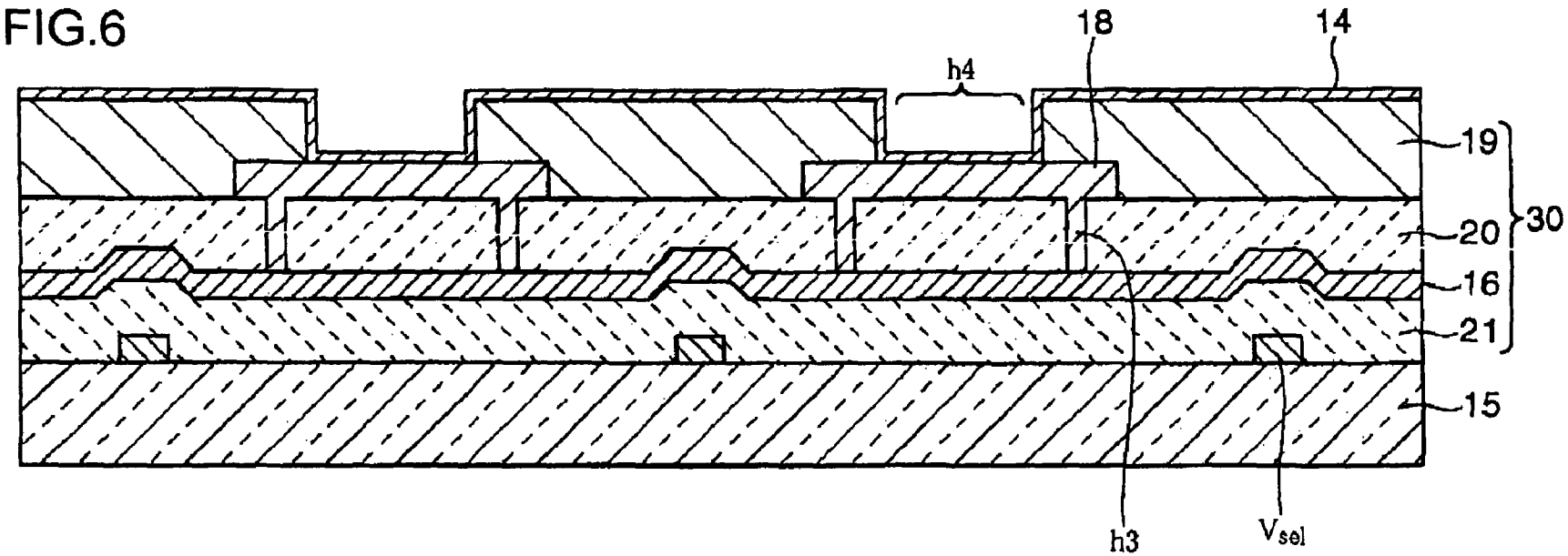
FIG. 6 is a cross-sectional view taken along the line B-B' of FIG. 5.
Figure 7:
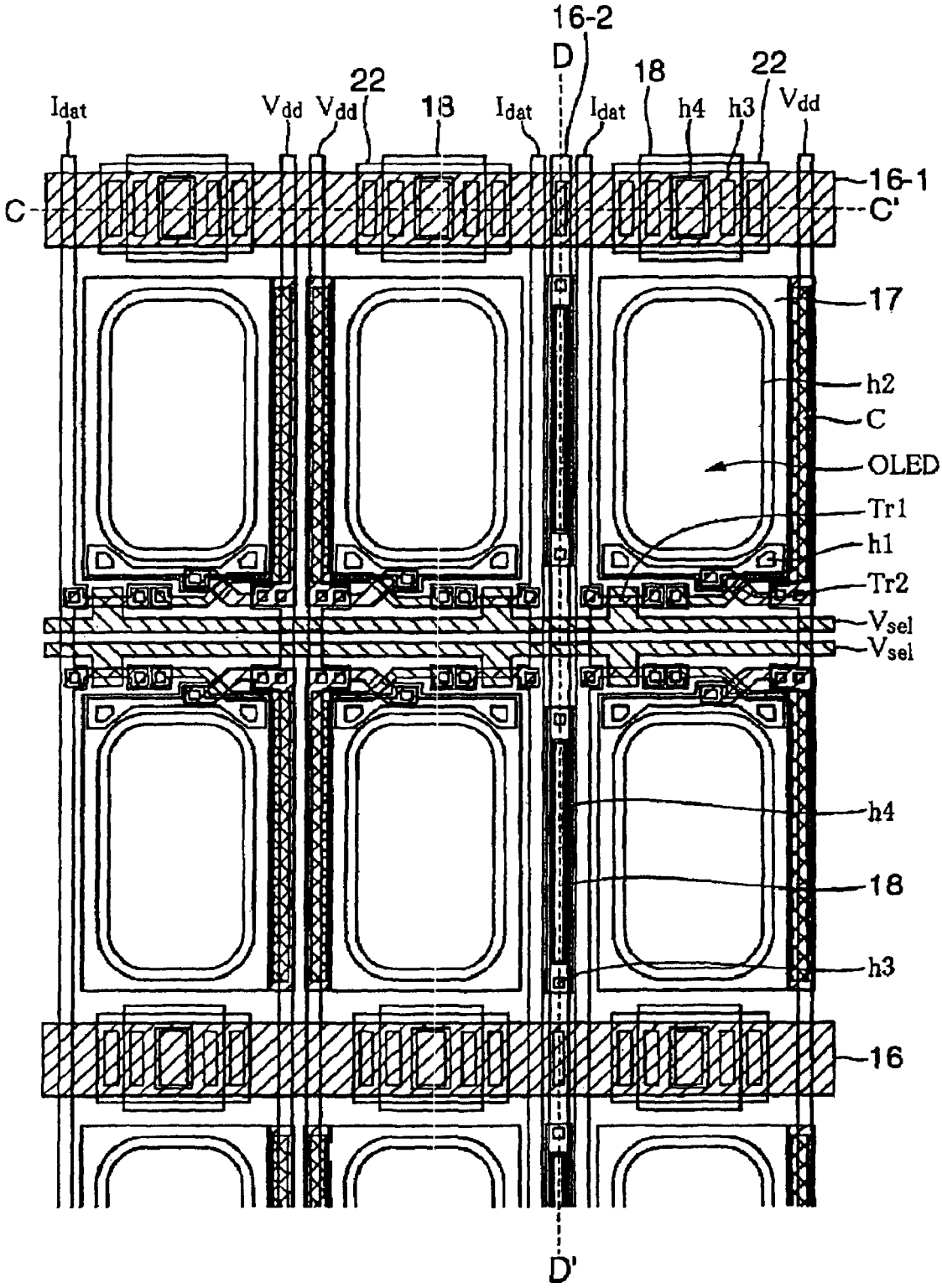
FIG. 7 shows a layout of wiring of the third embodiment of the present invention.
Figure 8:
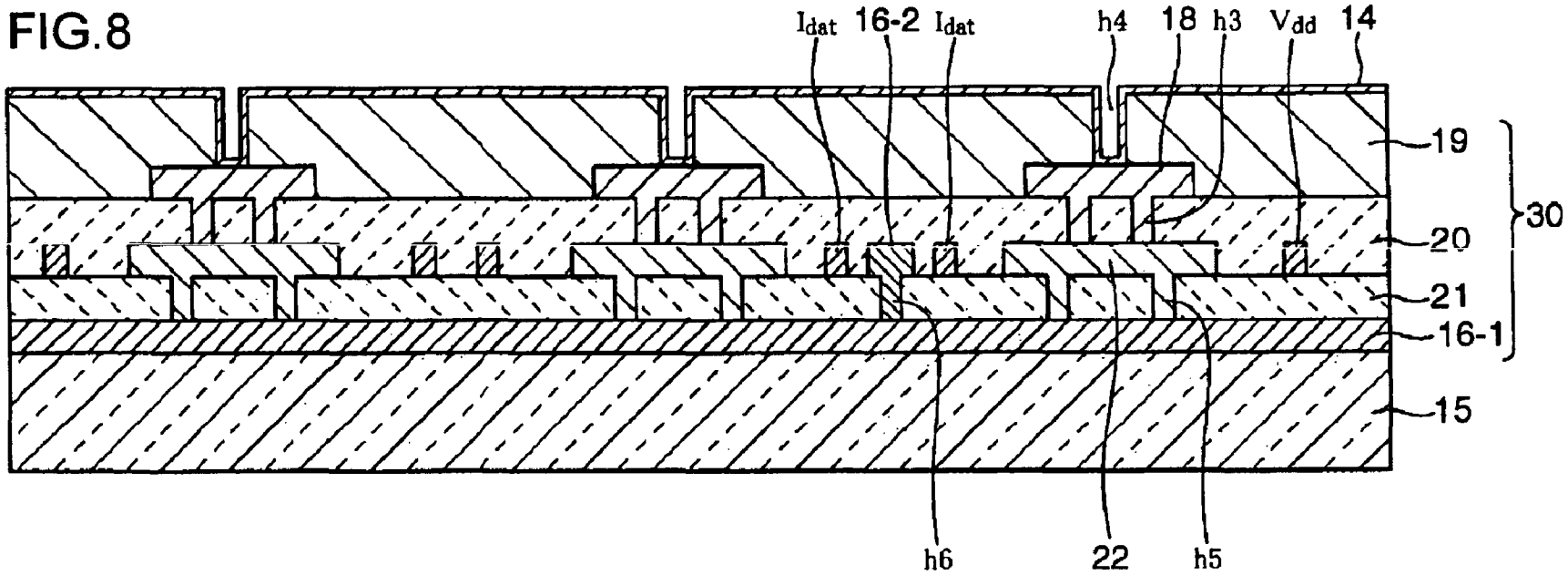
FIG. 8 is a cross-sectional view taken along the line C-C' of FIG. 7.
Figure 9:
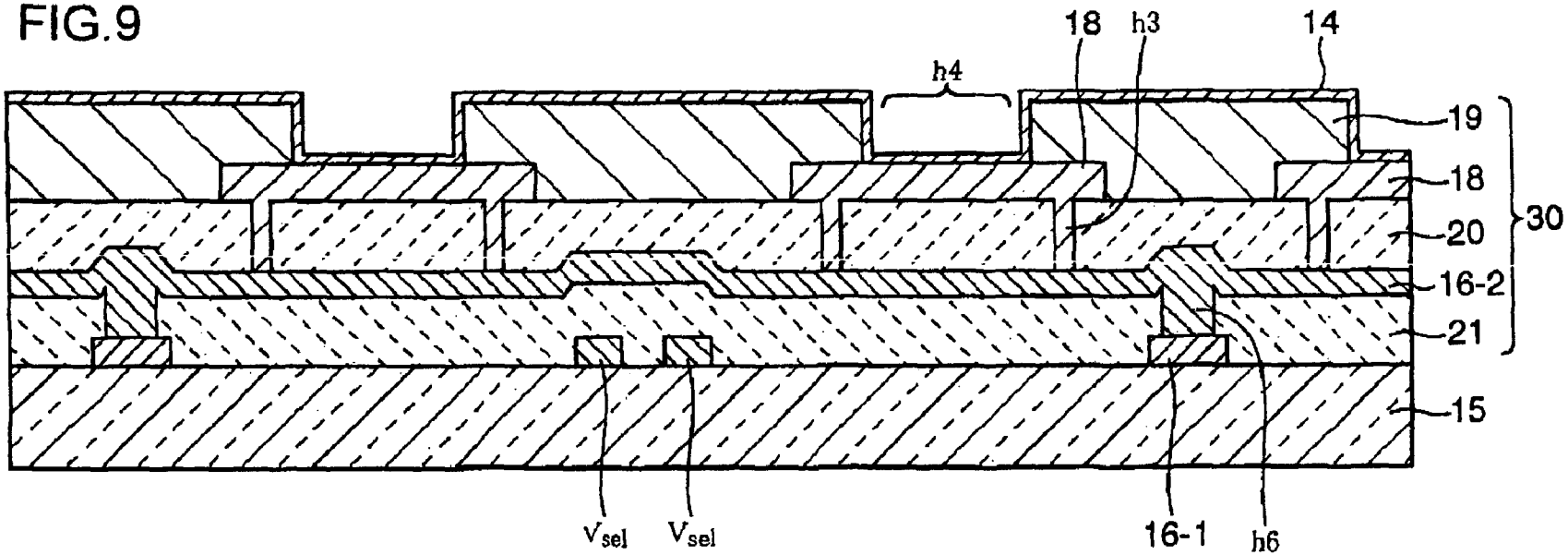
FIG. 9 is a cross-sectional view taken along the line D-D' of FIG. 7.
Figure 10A:
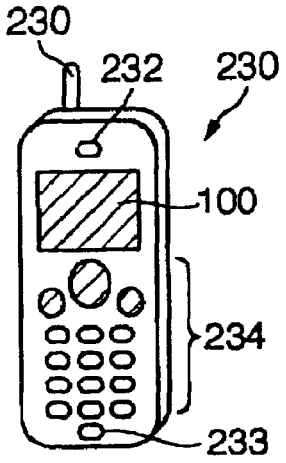
FIG. 10 shows applications of the organic EL display panel of the present invention.
Figure 10B:
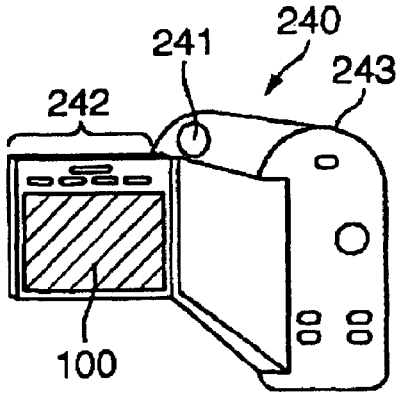
Figure 10C:
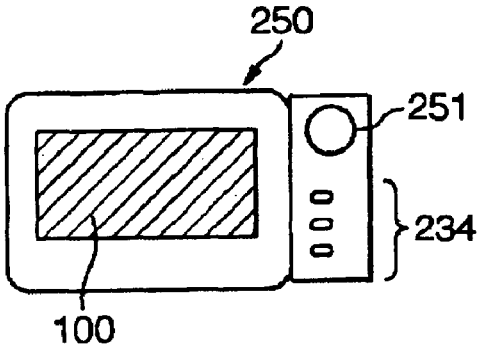
Figure 10D:
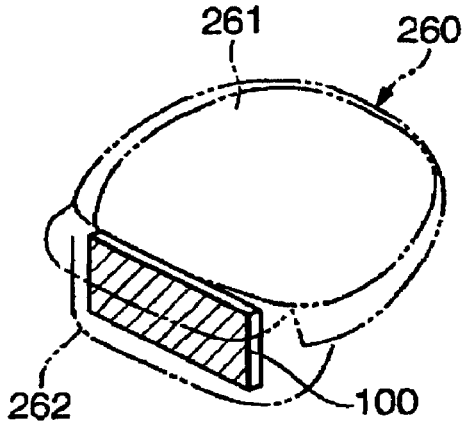
Figure 10E:
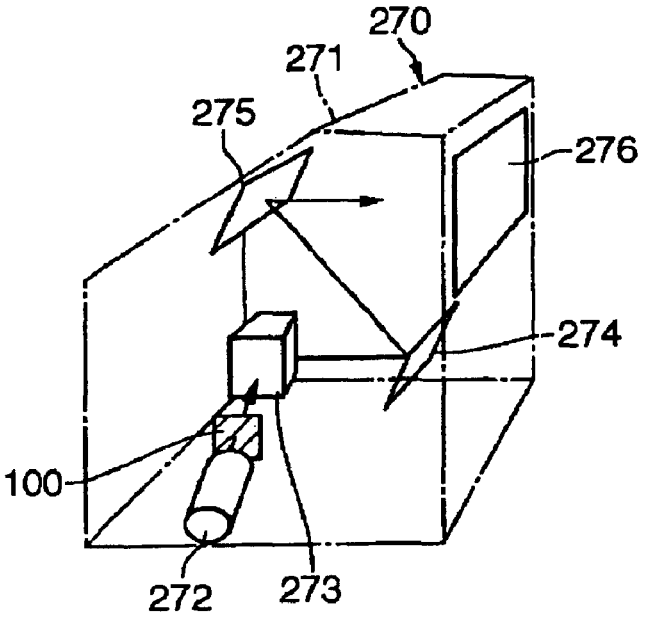
Figure 10F:
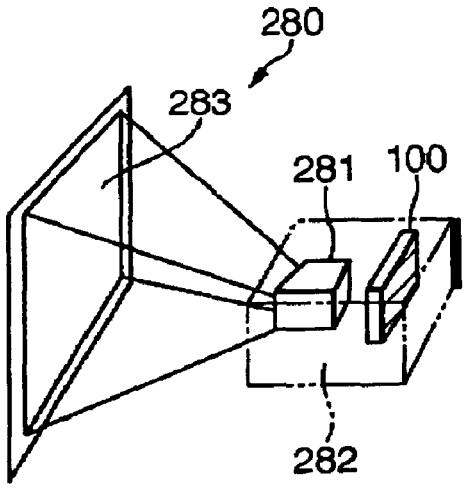

10: pixels
11: pixel area
12: scanning line driver
13: data line driver
14: cathode
15: substrate
16: auxiliary cathode wiring
16-1: first auxiliary cathode wiring
16-2: second auxiliary cathode wiring
17: pixel electrode
18: ITO layer
19: bank layer
20: planarizing film
21: insulating interlayer film
30: laminated structure
100: organic EL display panel
Tr1: switching transistor
Tr2: driving transistor
C: storage capacitor
OLED: light-emitting section
$V_{sel}$: scanning line
$I_{dat}$: data line
$V_{dd}$: power supply line

The invention claimed is:

1. An electro-optical apparatus that constitutes electro-optical devices having a laminated structure including a first electrode layer formed above an effective area of a substrate, and a second electrode layer formed above the first electrode layer, the electro-optical apparatus including:

first power lines that supply a voltage to the first electrode layer; and second power lines electrically connected to the second electrode layer, both the first and second power lines being arranged above the effective area, and being arranged in the same layer as the first electrode layer or in a layer below the first electrode layer; and the second power lines function as a cathode auxiliary wiring, and the second power lines being arranged in column and row directions of the effective area.

2. The electro-optical apparatus according to claim 1, the second power lines arranged in the column direction and the second power lines arranged in the row direction being formed in different layers via an interlayer insulating film, and both being electrically connected via a contact hole formed in the interlayer insulating film.

3. The electro-optical apparatus according to claim 2, the second power lines being formed in a line state in a predetermined dispersion density in any of the layers forming the interlayer laminated structure.

4. The electro-optical apparatus according to claim 3, an arrangement pitch of the second power lines being at a substantially equal interval.

5. The electro-optical apparatus according to claim 1, the second electrode layer has light transmissivity.

6. The electro-optical apparatus according to claim 1, the electro-optical devices being electroluminescent devices.

7. An electronic unit, comprising:

the electro-optical apparatus according to claim 1.

8. An electro-optical apparatus provided with a plurality of pixels including electro-optical devices having a laminated structure including a first electrode layer formed above an effective area of a substrate, and a second electrode layer formed above the first electrode layer, the electro-optical apparatus including:

first power lines that supply a voltage to the first electrode layer, second power lines electrically connected to the second electrode layer; and a plurality of scanning lines and data lines connected to the plurality of pixels, the first and second power lines being arranged above the effective area, and being arranged in the same layer as the first electrode layer or in a layer below the first electrode layer; and the wiring layout of the second power lines within the effective area being line symmetrical to arbitrary pixels arranged in parallel to the scanning lines or the data lines.

9. The electro-optical apparatus according to claim 8, a line width of the second power lines being substantially the same as a combined line width of two of the scanning lines.

10. The electro-optical apparatus according to claim 8, a line width of the second power lines is substantially the same as a combined line width of two of the data lines.

*11. An electro-optical apparatus comprising:*

*a substrate:*

*a first electrode disposed above the substrate;*

*a second electrode disposed over the first electrode; and*

*an auxiliary wiring electrically connected to the second electrode, the auxiliary wiring being disposed between the substrate and the first electrode and the first electrode being electrically separate from the auxiliary wiring.*

*12. The electro-optical apparatus according to claim 11, a planarizing layer being disposed between the second electrode and the substrate.*

*13. An electro-optical apparatus comprising:*

*a substrate;*

*a data line disposed above the substrate;*

*a first electrode disposed above the data line;*

*a second electrode disposed over the first electrode; and*

*an auxiliary wiring electrically connected to the second electrode,*

*the auxiliary wiring being disposed in the same layer as the data line and the first electrode being electrically separate from the auxiliary wiring.*

*14. An electro-optical apparatus comprising:*

*a substrate;*

*a scanning line disposed above the substrate;*

*a first electrode disposed above the scanning line;*

*a second electrode disposed over the first electrode; and*

*an auxiliary wiring electrically connected to the second electrode,*

*the auxiliary wiring being disposed in the same layer as the scanning line and the first electrode being electrically separate from the auxiliary wiring.*

* * * * *